US007341673B2

(12) United States Patent
Magni

(10) Patent No.: US 7,341,673 B2
(45) Date of Patent: Mar. 11, 2008

(54) METHODS AND APPARATUS FOR IN SITU SUBSTRATE TEMPERATURE MONITORING BY ELECTROMAGNETIC RADIATION EMISSION

(75) Inventor: Enrico Magni, Pleasanton, CA (US)

(73) Assignee: LAM Research Corporation, Fremont, CA (US)

( * ) Notice: Subject to any disclaimer, the term of this patent is extended or adjusted under 35 U.S.C. 154(b) by 69 days.

(21) Appl. No.: 10/640,350

(22) Filed: Aug. 12, 2003

(65) Prior Publication Data

US 2005/0037617 A1    Feb. 17, 2005

(51) Int. Cl.
*H01L 21/302* (2006.01)
(52) U.S. Cl. .............................. 216/59; 216/67; 438/14; 438/710; 427/8; 156/345.27
(58) Field of Classification Search ................ None
See application file for complete search history.

(56) References Cited

U.S. PATENT DOCUMENTS

| 4,959,244 | A | | 9/1990 | Penney et al. |
| 5,549,756 | A | | 8/1996 | Sorensen et al. |
| 5,564,830 | A | * | 10/1996 | Bobel et al. ............... 374/126 |
| 6,328,802 | B1 | | 12/2001 | Miller et al. |
| 6,352,870 | B1 | | 3/2002 | Lansford |
| 6,406,924 | B1 | | 6/2002 | Grimbergen et al. |
| 6,860,364 | B1 | | 3/2005 | Deemer |

FOREIGN PATENT DOCUMENTS

| EP | 0685720 A1 | 12/1995 |
| EP | 0685720 A1 | 12/1995 |
| EP | 1124255 A2 | 8/2001 |
| EP | 1124255 A2 | 8/2001 |
| JP | 05320917 A | * 12/1993 |

OTHER PUBLICATIONS

Müller, "Control of a Reactive Ion Etching Process for InP and Related Materials by In Situ Ellipsometry in the Near Infra Red" (Apr. 1990) 2$^{nd}$ Intl Conf, Lib of Cong #90-80596, IEEE Cat. No. 90CH2859-7, pp. 211-214.

(Continued)

*Primary Examiner*—Anita Alanko
(74) *Attorney, Agent, or Firm*—IP Strategy Group, P.C.

(57) ABSTRACT

A method in a plasma processing system of determining the temperature of a substrate. The method includes providing a substrate comprising a set of materials, wherein the substrate being configured to absorb electromagnetic radiation comprising a first set of electromagnetic frequencies, to convert the first set of electromagnetic frequencies to a set of thermal vibrations, and to transmit a second set of electromagnetic frequencies. The method also includes positioning the substrate on a substrate support structure, wherein the substrate support structure includes a chuck; flowing an etchant gas mixture into a plasma reactor of the plasma processing system; and striking the etchant gas mixture to create a plasma, wherein the plasma comprises the first set of electromagnetic frequencies. The method further includes processing the substrate with the plasma thereby generating the second set of electromagnetic frequencies; calculating a magnitude of the second set of electromagnetic frequencies; and converting the magnitude to a temperature value.

56 Claims, 12 Drawing Sheets

OTHER PUBLICATIONS

PCT International Search Report, Feb. 27, 2004, PCT/US03/25524.
"Notice of Office Action," mailed Jul. 19, 2007, for China Application No. 03819428.7; Filed on Aug. 13, 2003; Inventors: Lam Research Corporation.
Muller, "Control of A Reactive ION Etching Process for INP And Related Materials By In Situ Ellipsometry In The Near Infra Red", Proceedings of the Indium Phosphide And Related Materials Conference, Denver, Apr. 23-25, 1990, New York, IEEE, US, Vol. 1 Conf. 2, pp. 211-214.
Emcore Corporation, "RealTempTM Overview", http://www.emcoresupport.com/rt/PYROLASERTEXT_REV14a.html, pp. 1-6 printed on Jul. 25, 2003.
Phonons and the Debye Specific Heat, http://hyperphysics.phy-astr.gsu.edu/hbase/solids/phonon.html, pp. 1-6 printed on Jul. 27, 2003.
Stone et al., "Corrections for Wavelength Variations in Precision Interferometric Displacement Measurements", Journal of Research of the National Institute of Standards and Technology, vol. 101, No. 5, Sep.-Oct. 1996, pp. 671-674.
Gabriel et al., "In Situ Wafer Temperature Measurement During Plasma Etching" Solid State Technology Magazine, vol. 42, Issue 10, Oct. 1999, pp. 1-6.
Tutorial Glossary Printed from Internet no date available.
"E & CE 209 Electronic and Electrical Properties of Materials" Tutorial No. 6 Printed from the Internet Feb. 2002.

* cited by examiner

METHODS AND APPARATUS FOR IN SITU SUBSTRATE TEMPERATURE MONITORING BY ELECTROMAGNETIC RADIATION EMISSION

BACKGROUND OF THE INVENTION

The present invention relates in general to substrate manufacturing technologies and in particular to methods and apparatus for in situ wafer temperature monitoring by electromagnetic radiation emission.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BF_3$, $Cl_2$, etc.) are then flowed into the chamber and struck to form a plasma to etch exposed areas of the substrate.

Among the set of process variables that can be adjusted to optimize the plasma process are gas composition, gas phase, gas flow, gas pressure, RF power density, voltage, magnetic field strength, and wafer temperature. Although in theory it may be beneficial to optimize each variable to each processing step, in practice it is often difficult to achieve.

Substrate temperature, for example, is important since it may subsequently affects plasma selectivity by changing the deposition rate of polymeric films, such as poly-florocarbon, on the wafer surface. Careful monitoring may minimize variation, allow a wider process window for other parameters, and improve process control. However, in practice it may be difficult to directly determine temperature without affecting the plasma process.

One technique, for example, measures the substrate temperature by a temperature probe. Referring now to FIG. 1A, a simplified cross-sectional view of a plasma processing system is shown, in which a temperature probe is used to determine wafer temperature. Generally, an appropriate set of etchant source gases is flowed into chamber 100 and struck to form a plasma 102, in order to etch exposed areas of substrate 104, such as a semiconductor wafer or a glass pane. Substrate 104 generally sits on chuck 106. Electromagnetic radiation produced by plasma 102, in combination kinetic energy transferred by the plasma itself, causes substrate 104 to absorb thermal energy. In order to determine substrate temperature, probe 108 extends from beneath substrate 104 to contact the substrate. However, probe 108 may also dislodge the wafer from the chuck, and subsequently ruin a costly wafer.

Another technique is the measurement of Infrared (IR) radiation from the substrate with a conventional pyrometer. Generally, heated materials emit electromagnetic radiation in the IR region. This region generally comprises a wavelength range from 8 to 14 μm, or a frequency range from 400 to 4000 cm−1, where cm−1 is known as wavenumber (1/wavelength) and is equivalent to frequency. Measured IR radiance can then be used to calculate substrate temperature by using Plank's radiation law for blackbody radiation.

Referring now to FIG. 1B, a simplified cross-sectional view of a plasma processing system is shown, in which a conventional pyrometer is used to determine wafer temperature. As in FIG. 1A, an appropriate set of etchant source gases is flowed into chamber 100 and struck to form a plasma 102, to etch exposed areas of substrate 104. Substrate 104 generally sits on a chuck 106. Plasma 102 may also produce a spectrum of electromagnetic radiation, some of which is generally IR. It is this radiation (along with kinetic energy transferred by the plasma itself) that may cause substrate 104 to absorb thermal energy. Substrate 104, in turn, also generates IR radiation corresponding to its temperature. However, since substrate's 104 IR radiance is generally substantially smaller than that of the plasma, a pyrometer may not be able to distinguish between the two. Hence, the calculated temperature would be approximately that of the background plasma itself and not of the substrate.

Still another technique is the use of an interferometer to measure a change in substrate thickness due to absorbed thermal energy. Generally, an interferometer measures a physical displacement by sensing a phase difference of an electromagnetic beam reflected between two surfaces. In a plasma processing system, an electromagnetic beam may be transmitted at a frequency for which the substrate is translucent, and positioned at an angle beneath the substrate. A first portion of the beam may then reflect on the substrate's bottom surface, while the remaining portion of the beam may reflect on the substrate's top surface.

Referring now to FIG. 1C, a simplified cross-sectional view of a plasma processing system is shown, in which an interferometer is used to determine wafer temperature. As in FIG. 1A, an appropriate set of etchant source gases is flowed into chamber 100 and struck to form a plasma 102, to etch exposed areas of substrate 104, such as a semiconductor wafer or a glass pane. Substrate 104 generally sits on chuck 106. Plasma 102 produces electromagnetic radiation, some of which is IR. This radiation (along with kinetic energy transferred by the plasma itself), causes substrate 104 to absorb thermal energy and expand by an amount 118. An electromagnetic beam transmitter 108, such as a laser, transmits beam 112 at a frequency for which substrate 104 is translucent. A portion of the beam reflects then reflects 114 at point 124 on the substrate's bottom surface, while the remaining portion of beam 116 reflects at point 122 on the substrate's top surface. Since the same beam 112 is reflected at two points 122 and 124, the resulting beams 114 and 116 may be out of phase, but otherwise identical. Interferometer 130 can then measure the phase shift and determine the substrate thickness 118. By taking successive measures, a change in substrate thickness may be determined. However, a change to substrate thickness may only be used determine a corresponding change in temperature, and not a specific temperature. Furthermore, since the transmitter is also located in the plasma processing system, it can become damaged by plasma 102, and may also produce contaminants that may affect manufacturing yield.

Because of these difficulties, substrate temperature is normally inferred from the rate of heat dissipation from the plasma processing system. Generally, some type of cooling system is coupled to the chuck in order to achieve thermal equilibrium once the plasma is ignited. That is, although substrate temperature in generally stabilized within a range, its exact value is commonly unknown. For example, in creating a set of plasma processing steps for the manufacture of a particular substrate, a corresponding set of process variables, or recipe, is established. Since the substrate temperature may not be directly measured, optimizing a recipe is difficult. The cooling system itself is usually comprised of a chiller that pumps a coolant through cavities in within the chuck, and helium gas pumped between the chuck and the wafer. In addition to removing the generated heat, the helium gas also allows the cooling system to rapidly calibrate heat dissipation. That is, increasing helium pressure subsequently also increases the heat transfer rate.

Referring now to FIG. 1D, a simplified diagram of temperature 180 versus time 181 is shown for a substrate 188, after the plasma is ignited. Initially, the substrate is at ambient temperature range 182. As the plasma is ignited, the substrate absorbs thermal energy during a stabilization period 184. After a period of time, the substrate temperature stabilizes at range 186. Since the duration of stabilization period 184 may be a substantial portion of the total plasma processing step, decreasing stabilization period 184 may directly improve yield. If the substrate temperature could be directly measured in a plasma processing system, the cooling system could be optimized to minimize stabilization period 184.

In addition, depending on the plasma processing activity, its duration, or its order relative to other steps, a different amount of heat may be generated and subsequently dissipated. Since as previously explained, substrate temperature may directly affect the plasma process, first measuring and then adjusting the substrate temperature would allow plasma processing steps to be better optimized.

Furthermore, the physical structure of the plasma processing chamber, itself, may change. For example, pollutants may be cleaned from the plasma processing system by striking the plasma without the substrate. However, the chuck is no longer shielded by the substrate, and is subsequently etched. As the cleaning process is repeated, the substrate's surface roughness increases, modifying its heat transfer efficiency. Eventually, the cooling system cannot adequately compensate, and the recipe's parameters are invalidated. Since it is often impractical to determine when this point is exactly reached, the chuck is generally replaced after a certain amount of operational hours, which in practice is normally only a fraction of its useful life. This can both increase productions costs, since an expensive chuck may be needless replaced, and reduces yield, since the plasma processing system must be taken offline for several hours to replace the chuck.

In addition, recipe parameters may need to be adjusted since an otherwise identical piece of fabrication equipment may be installed at a different time, or is used to a different degree, its maintenance cycle does not necessarily match that of the others. The recipe parameters may need to be adjusted when moving the process to a newer version of the plasma processing system, or when transferring the process to a plasma processing system that can process a larger substrate size (e.g., 200 mm to 300 mm). Ideally, it would be beneficial to maintain the same recipe parameters (e.g., chemistry, power, and temperature). However, since wafer temperature is inferred and not measured, the process may need to be substantially adjusted through trial and error in order to achieve a similar production profile.

In view of the foregoing, there are desired improved methods and apparatus for in situ wafer temperature monitoring.

SUMMARY OF THE INVENTION

The invention relates, in one embodiment, to a method in a plasma processing system of determining the temperature of a substrate. The method includes providing a substrate comprising a set of materials, wherein the substrate being configured to absorb electromagnetic radiation comprising a first set of electromagnetic frequencies, to convert the first set of electromagnetic frequencies to a set of thermal vibrations, and to transmit a second set of electromagnetic frequencies. The method also includes positioning the substrate on a substrate support structure, wherein the substrate support structure includes a chuck; flowing an etchant gas mixture into a plasma reactor of the plasma processing system; and striking the etchant gas mixture to create a plasma, wherein the plasma comprises the first set of electromagnetic frequencies. The method further includes processing the substrate with the plasma thereby generating the second set of electromagnetic frequencies; calculating a magnitude of the second set of electromagnetic frequencies; and converting the magnitude to a temperature value.

The invention relates, in another embodiment, to an apparatus for determining temperature in a plasma processing system. The apparatus includes a substrate comprising a set of materials, wherein the substrate is configured to absorb electromagnetic radiation comprising a first set of electromagnetic frequencies, to convert the first set of electromagnetic frequencies to a set of thermal vibrations, and to transmit a second set of electromagnetic frequencies. The apparatus also includes a substrate support structure, wherein the substrate support structure includes a chuck, and the substrate is positioned on the substrate support structure; a means of flowing an etchant gas mixture into a plasma reactor of the plasma processing system; and a means of striking the etchant gas mixture to create a plasma, wherein the plasma comprises the first set of electromagnetic frequencies. The apparatus further includes a means of processing the substrate with the plasma thereby generating the second set of electromagnetic frequencies; a means of calculating a magnitude of the second set of electromagnetic frequencies; and a means of converting said magnitude to a temperature value.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that in a plasma processing system, phonons can be used for in situ wafer temperature monitoring. In general, phonons are thermal energy vibrations in a substrate, which, in turn, generate electromagnetic waves. Discrete bonded materials within the substrate, particularly ones that exist within a crystalline structure, generally radiate electromagnetic radiation at a frequency unique to the material, and with a magnitude correlated to the total amount of absorbed thermal energy in the substrate. In a non-obvious manner, by measuring the magnitude of radiation at a frequency that is characteristic of a substrate material, but generally not found anywhere else in the plasma processing system, the temperature of the substrate can be calculated in a substantially accurate manner. In one embodiment, this calculation can be accomplished using Plank's radiation law for blackbody radiation, corrected by the substrate's specific emissivity.

A number of frequencies may be used, preferably in the IR and far-IR regions. The frequency selected should substantially correspond to a region of the spectrum where substrate material has a strong absorption coefficient. A large number of spectral regions may be used. Most favorable phonons are in the region between 6 μm and 50 μm. In one embodiment, for a Si substrate, a measurable radiation may be produced by Si—Si vibrations at 16.4 μm. In another embodiment, the monitored phonon may be produced by the Si—O—Si vibration at 9.1 μm, where interstitial oxygen participates to the atomic motion. Other spectral regions may be used, taking advantage of the rich Si—Si, Si—O, and Si—C (substitutional carbon) vibrational spectrum.

Figure 1A:
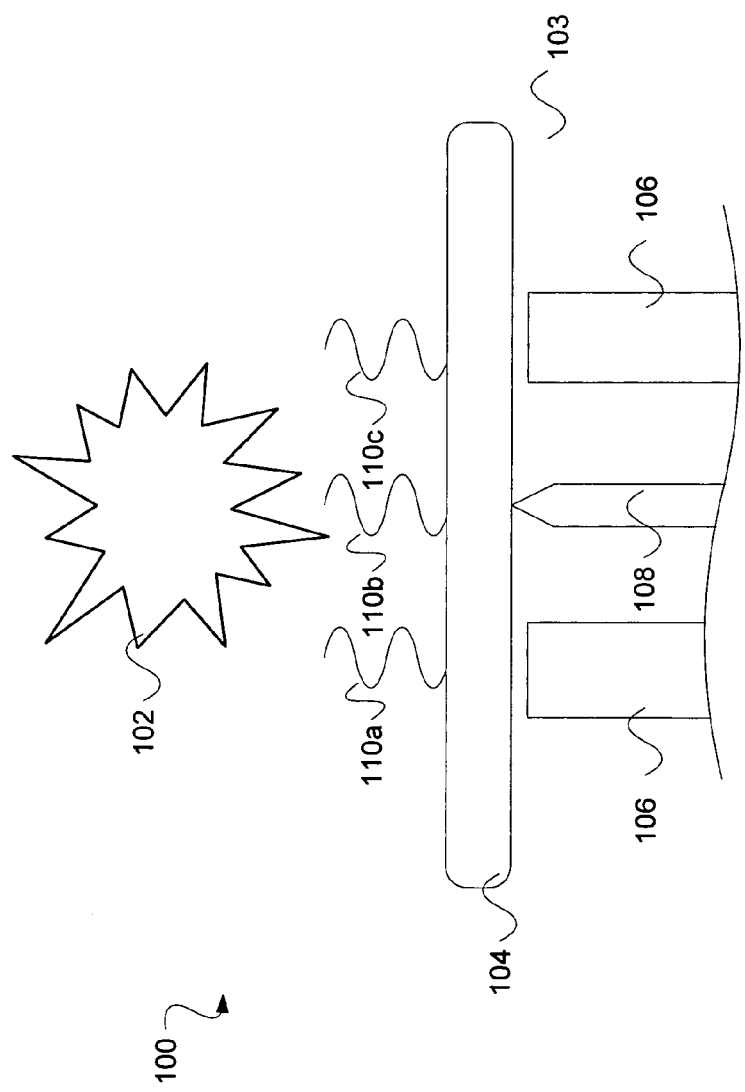
FIG. 1A depicts a simplified cross-sectional view of a plasma processing system in which a temperature probe is used to determine wafer temperature.
Figure 1B:
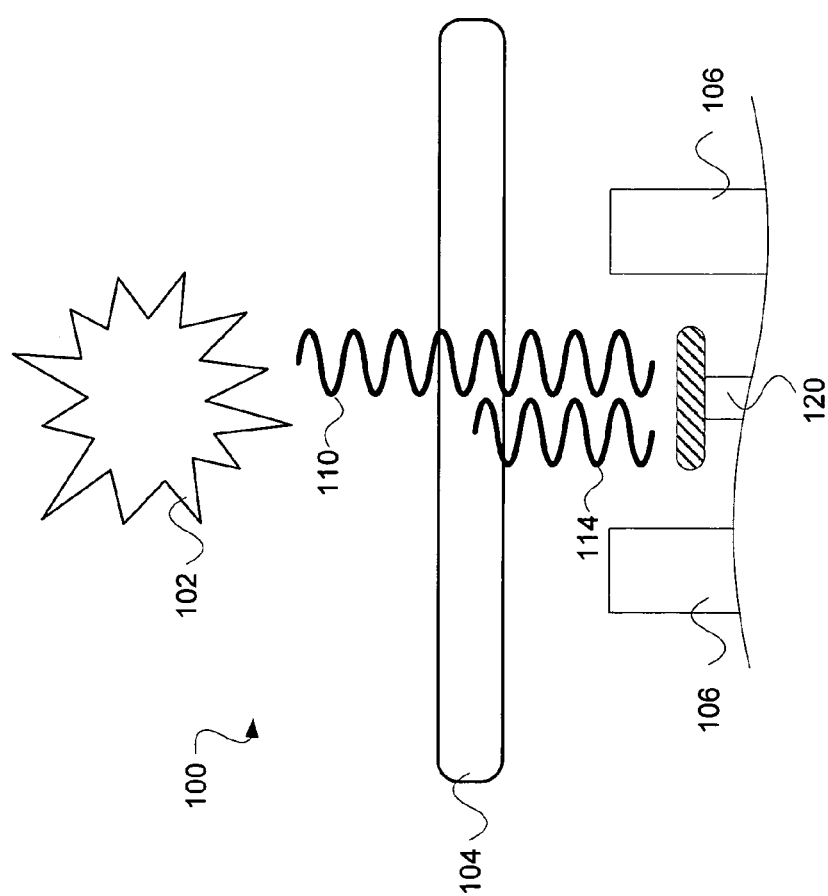
FIG. 1B depicts a simplified cross-sectional view of a plasma processing system in which a conventional pyrometer is used to determine wafer temperature.
Figure 1C:
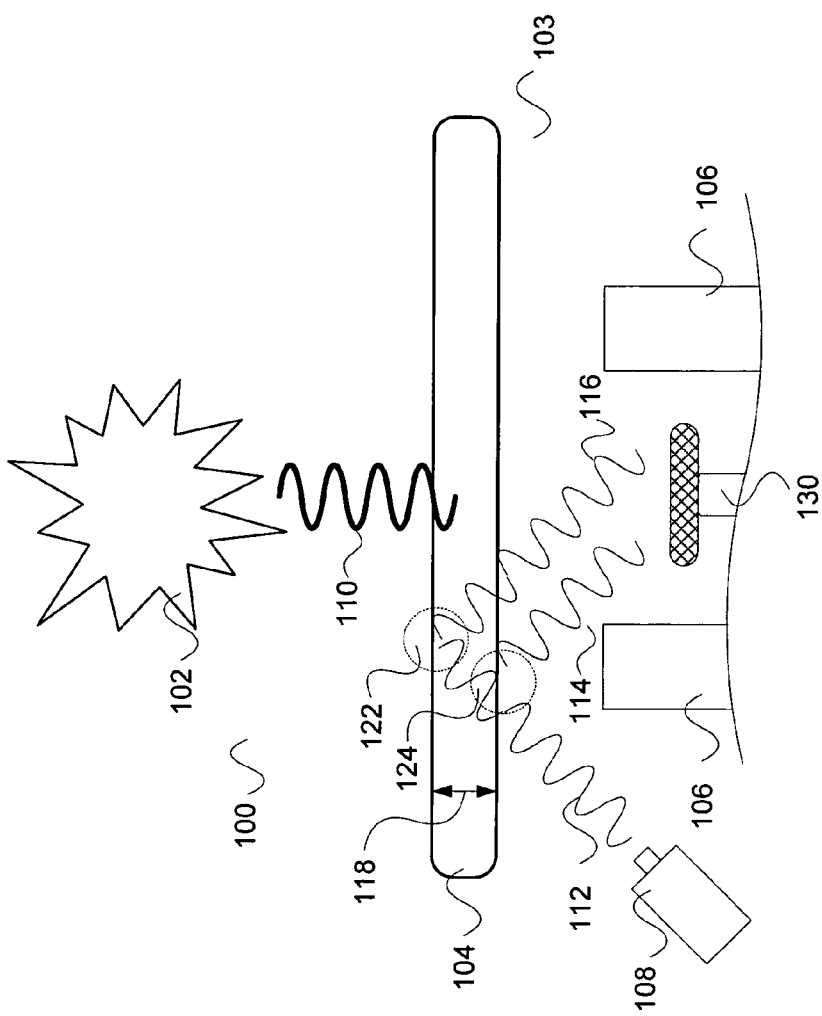
FIG. 1C depicts a simplified cross-sectional view of a plasma processing system in which an interferometer is used to determine wafer temperature.
Figure 1D:
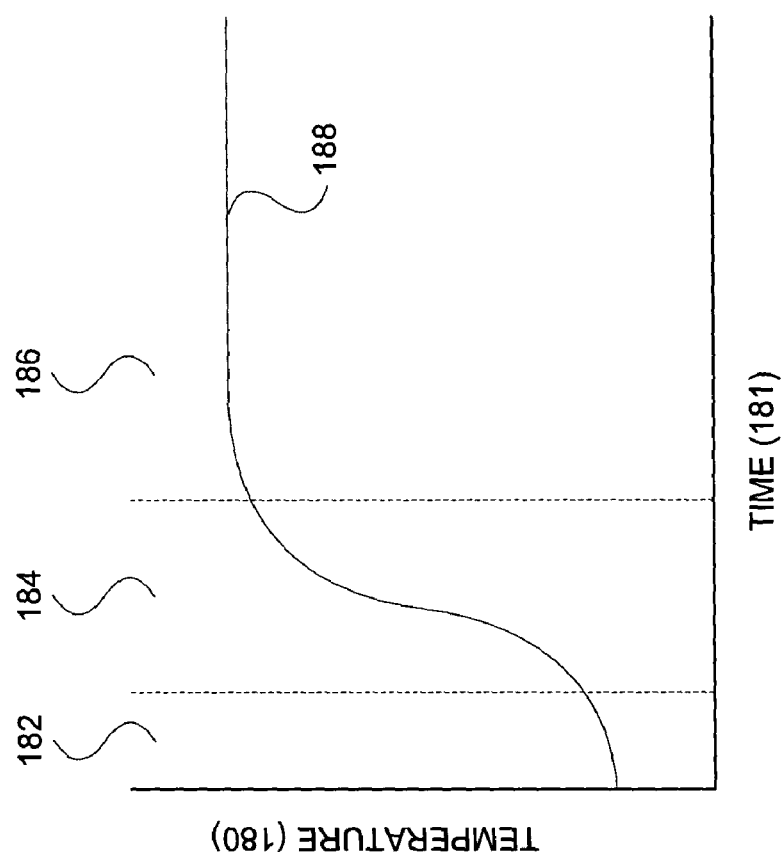
FIG. 1D depicts a simplified diagram of temperature versus time for a substrate, after the plasma is ignited.
Figure 2A:
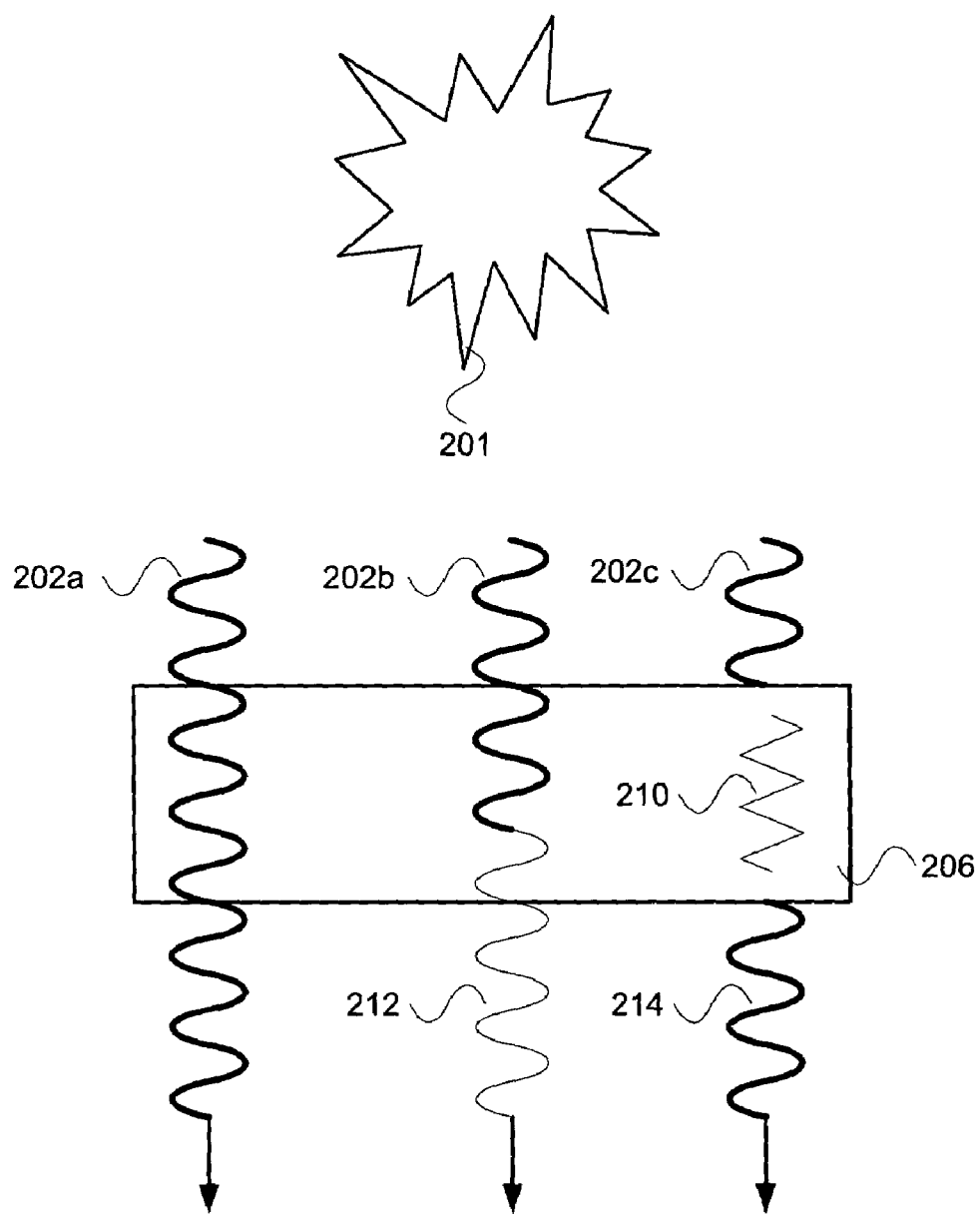
FIG. 2A depicts a simplified diagram of a process in which a phonon is shown, according to one embodiment of the invention.

Referring now to FIG. 2A, a simplified diagram of a process in which a phonon is shown, according to one embodiment of the invention. In a plasma processing system, a plasma 201 is struck producing electromagnetic radiation 202 across the entire spectrum from the X-ray region to the microwave region. Most of this radiation 202a passes through the substrate without effect. This is the transmitted light. Examples are the X-rays, most of the infrared spectrum. A second portion of this radiation 202b is partially absorbed by substrate 206 and partially transmitted 212. Examples are light in the near infrared and in the infrared proper, at frequencies for which the substrate has a low absorbance or extinction coefficient. The portion that is absorbed is substantially converted to thermal energy. The remaining portion 202c is substantially absorbed in its entirety and converted to thermal energy. The aggregate thermal energy, in turn, causes phonons 210 in materials bonded within the substrate's lattice structure, which subsequently cause radiation 214 to be produced at a specific measurable frequency.

Figure 2B:
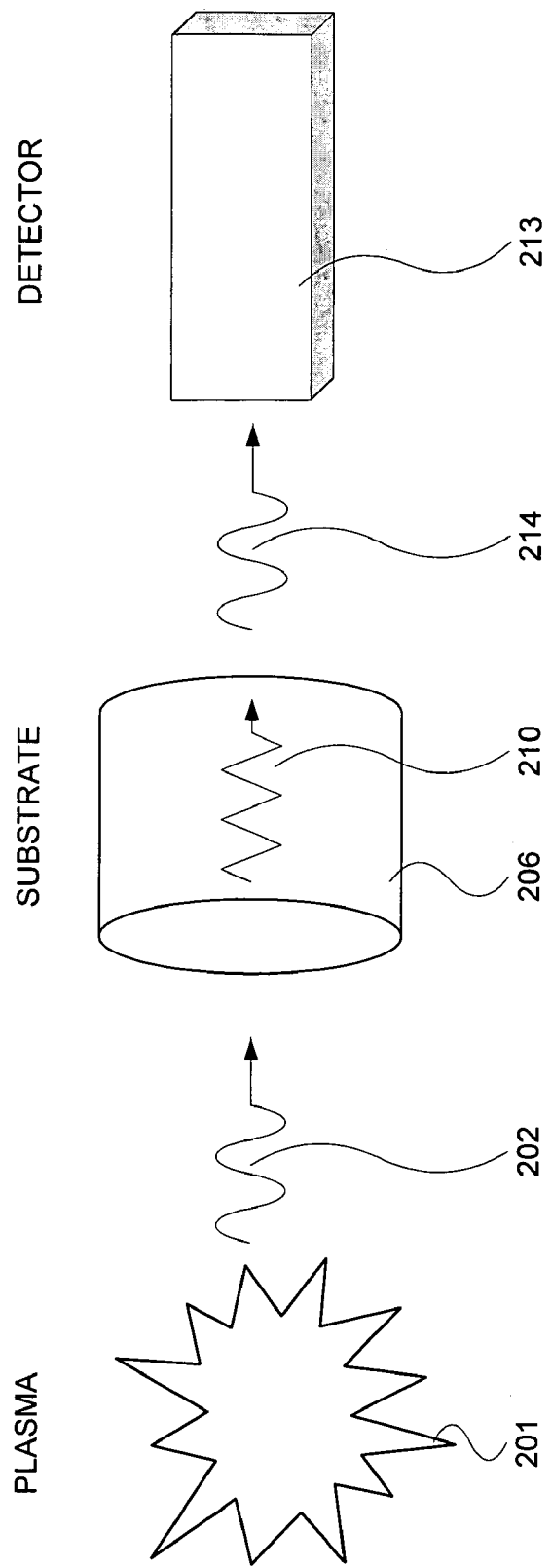
FIG. 2B depicts a simplified diagram of a process in which a substrate temperature is measured, according to one embodiment of the invention.

Referring now to FIG. 2B, a simplified diagram of a process in which a substrate temperature is measured, according to one embodiment of the invention. As in FIG. 2A, a plasma 201 is struck ma plasma processing system producing electromagnetic radiation 202. The portion of the electromagnetic radiation that is absorbed is substantially converted to thermal energy. This thermal energy, in turn, creates phonons 210 in materials bonded within the substrate's lattice structure, which subsequently causes radiation 214 to be created, and subsequently measured by detector 213. Radiation 214 is in thermal equilibrium with the emitting substrate. The detector 213 consists of 1) a device capable of discriminating the emitted electromagnetic radiation according to its frequency (or wavelength), and 2) a device capable of measuring the electromagnetic radiation intensity at the frequency (or wavelength) selected by device 1). In one embodiment, detector 213 may have an optical dispersing element as monochromator (e.g. multilayer dielectric interference filter, prism, grating, Fabry-Perot interferometer) that is optimized to transmit radiation intensity for the band of the electromagnetic spectrum corresponding to the selected material. In another embodiment, a suitable band filter is used to select the radiation of interest. Any photosensitive device capable of measuring the radiation intensity selected by the monochromator may be used in the detector. Examples are thermal detectors (thermopile) photoconductive and photovoltaic detectors.

Figure 2C:
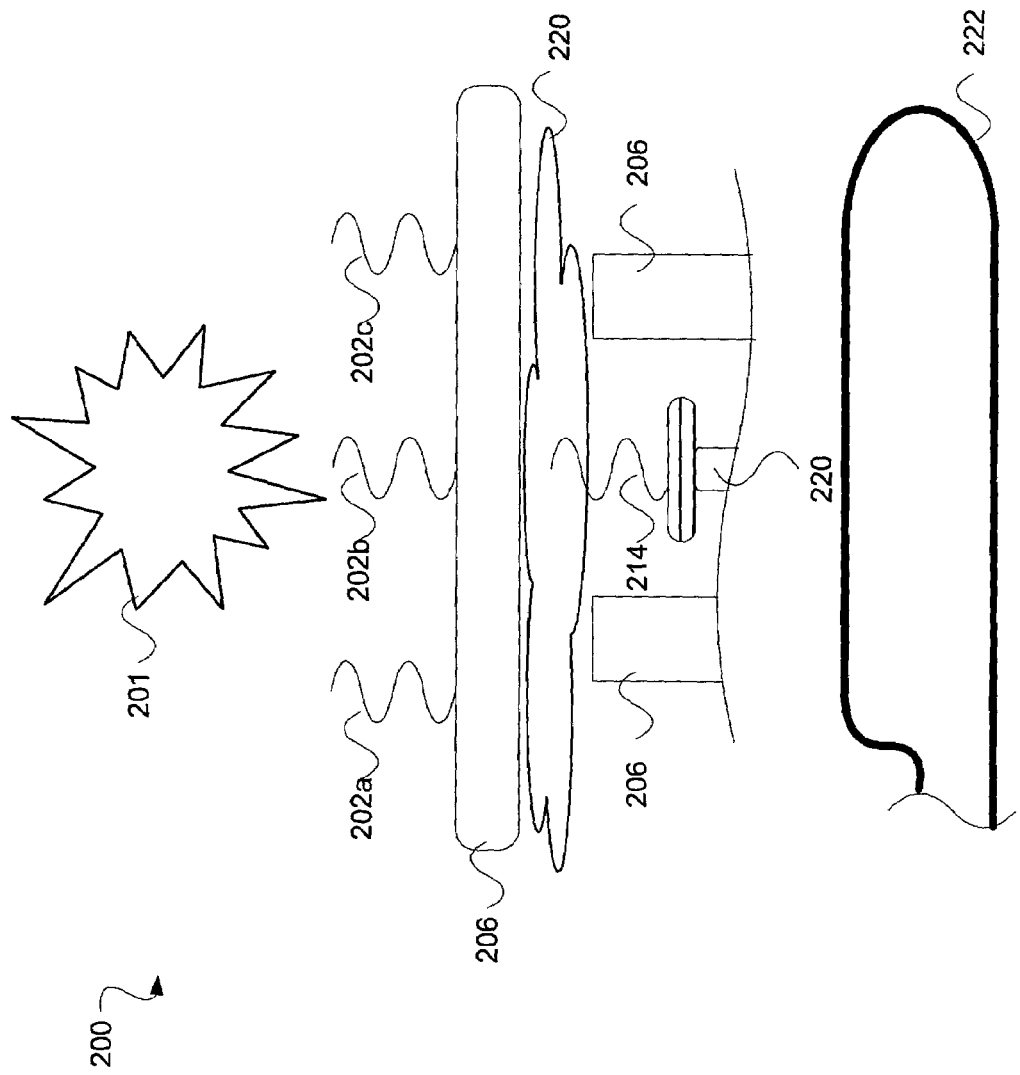
FIG. 2C depicts a more detailed diagram of FIG. 2B, according to one embodiment of the invention.

Referring now to FIG. 2C, a more detailed diagram of FIG. 2B is shown, according to one embodiment of the invention. As in FIG. 2A, a plasma 201 is struck in plasma processing system 200 producing electromagnetic radiation 202. The portion of the electromagnetic radiation that is absorbed is substantially converted to thermal energy, which subsequently causes phonons to be created within substrate 206. By measuring radiation 214 at a frequency corresponding to the selected material with detector 220 (i.e., Si—Si at 16.4 μm, Si—O—Si at 9.1 μm, etc.), the temperature of substrate 206 can be calculated.

Plasma processing system 200 further may include some type of cooling system that is coupled to the chuck in order to achieve thermal equilibrium. This cooling system is usually comprised of a chiller that pumps a coolant through cavities in within the chuck, and helium gas pumped between the chuck and the wafer. In addition to removing the generated heat, the helium gas also allows the cooling system to rapidly calibrate heat dissipation. That is, increasing helium pressure subsequently also increases the heat transfer rate.

In contrast to the prior art, substrate 206 temperature can be maintained in a substantially stable manner during plasma processing by adjusting the temperature setting of the chiller 220 and the pressure of helium 220. In particular, as the chuck's heat transfer efficiency is reduced during subsequent plasma cleanings, helium 220 pressure can be increased to compensate, thereby substantially maintaining substrate temperature. This may allow the chuck to be used for a substantially longer period of time, decreasing chuck replacement costs. In addition, yield may further be maintained or improved, since plasma processing system 200 can be operated for a longer duration before maintenance is required.

Furthermore, a specific plasma processing step can be optimized for a narrow substrate temperature band, as opposed to being sub-optimized to a broad substrate temperature window. In addition, process steps can be more easily interchanged since residual process heat from a previous step can be rapidly attenuated.

Referring now to FIGS. 3A-E, the measurement of phonons for substrate in an Exelan™ HPT plasma processing system is shown, according to one embodiment of the invention. Although in this example, the Exelan HPT plasma processing system is shown, other plasma processing systems can be used as well. The etch process is conducted under the following process conditions:

Pressure: 50 mT
Power: 1800 W (2 MHz)/1200 W (27 MHz)
Plasma Composition: Ar: 270 sccm; $C_4F_8$: 25 sccm; $O_2$: 10 sccm
Temperature: 20 C
Duration: 300 sec Referring now to FIG. 3A, a simplified diagram of signal intensity versus time within a plasma processing system is shown, according to one embodiment of the invention. No substrate is present during the execution of this test. In general, as the plasma is struck, the chamber walls absorb thermal energy over time 316 generating photons. In this example, the resulting electromagnetic radiation is being measured for Si—Si at 16.4 μm. In another embodiment, radiation produced by Si—O—Si would also produce a substantially similar diagram at 9.1 μm. This figure shows that the electromagnetic radiation increases in intensity as the plasma chamber walls become hotter and hotter by action of the plasma. As the plasma is turned off at 320, the corresponding signal intensity also is reduced, since the chamber walls begin to cool. This figure shows that the electromagnetic radiation emitted by the chamber walls may interfere with the substrate temperature measurement if not dealt with correctly.

Figure 3A:
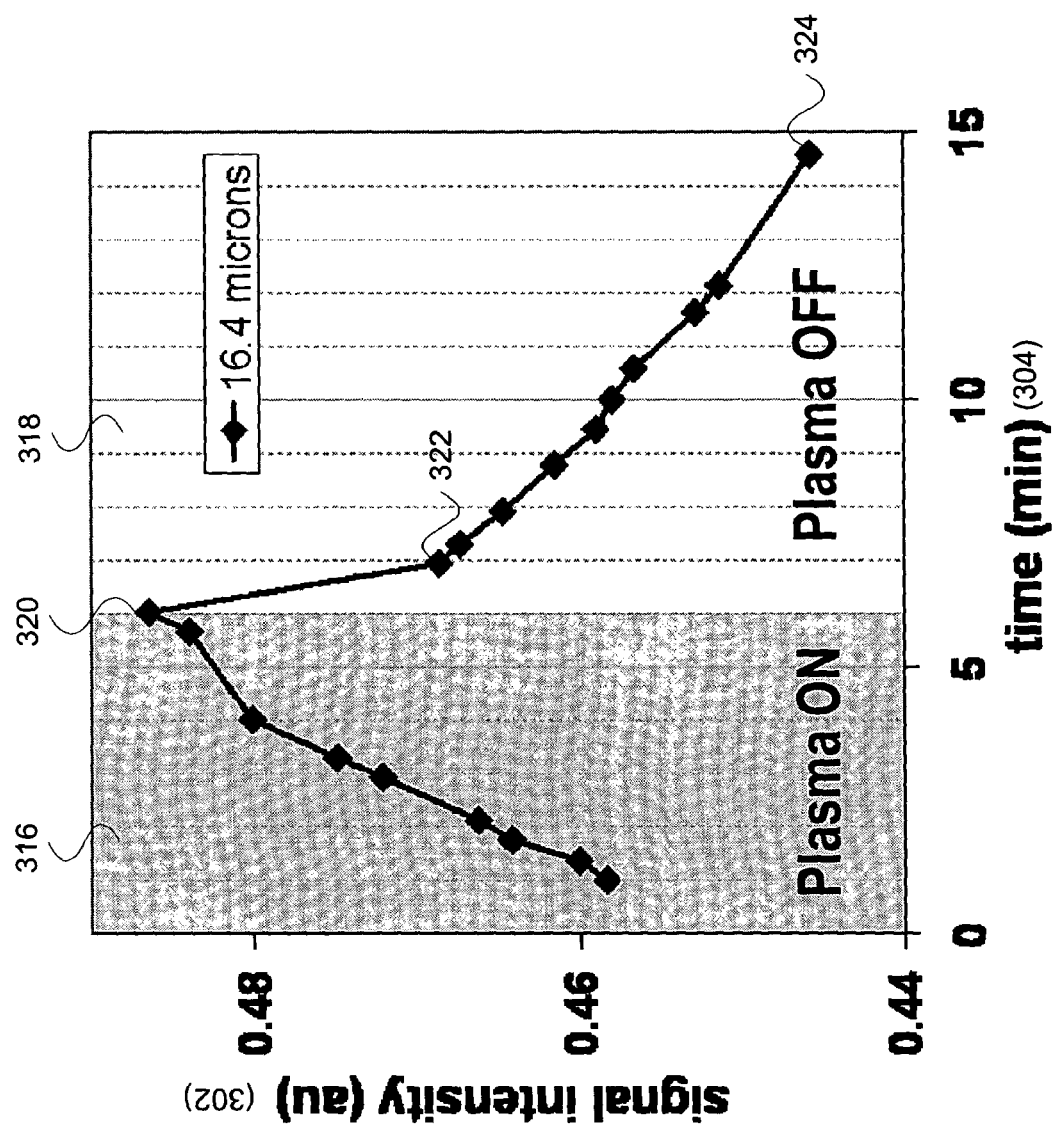
FIGS. 3A-E depict the measurement of phonons for substrate in a plasma processing system, according to one embodiment of the invention.
Figure 3B:
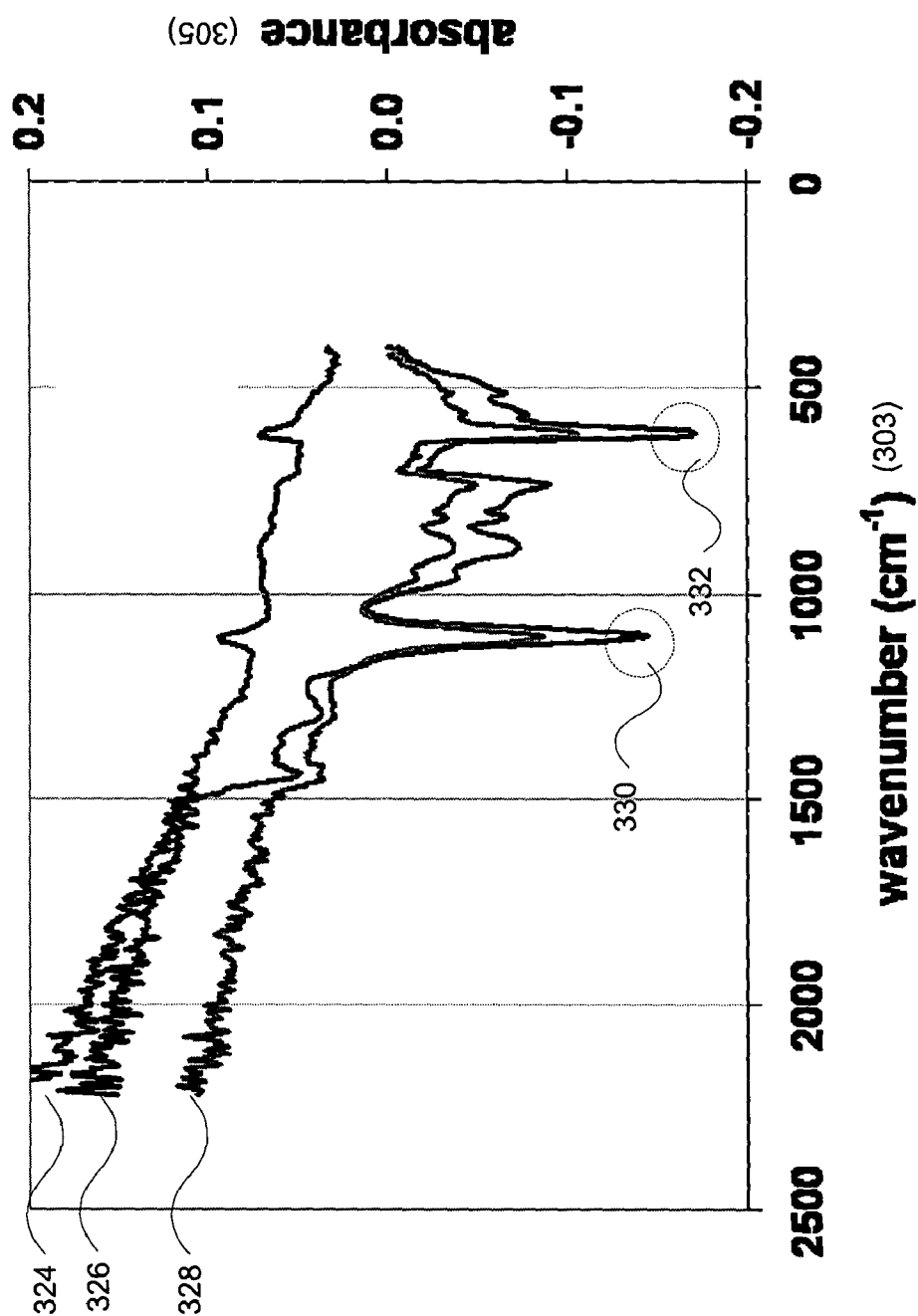

Referring now to FIG. 3B, a simplified diagram of wavenumber versus absorbance within a plasma processing system is shown, according to one embodiment of the invention. Three graphs are shown. Graph 324 displays substrate absorbance for a substrate at 20 C. Graph 326 displays substrate absorbance for a substrate at 70 C. And graph 328 displays substrate absorbance for a substrate at 90 C. In general, the higher the substrate temperature, the more negative the corresponding absorbance becomes. Across the spectrum of IR radiation generated in the plasma processing system, two absorbance peaks become apparent, a first peak 330 at 16.4 μm produced by Si—Si, and a second peak 332 at 9.1 μm produced by Si—O—Si. The most spectral variation is observed for the two peaks at 16.4 μm and 9.1 μm. The signal intensity is most sensitive to the substrate temperature at these wavelengths. Graph 324 shows positive absorbance at both 16.4 μm and 9.1 μm, indicating that the substrate absorbs more electromagnetic radiation at these wavelengths than it emits. Graphs 326 and 328 show negative absorbance at both 16.4 μm and 9.1 μm, for the substrate emits more radiation than it absorbs at these wavelengths. The radiation emitted by the substrate and measured by the detector is in thermal equilibrium with the substrate and is independent on the radiation emitted by the plasma and by the processing chamber walls.

Figure 3C:
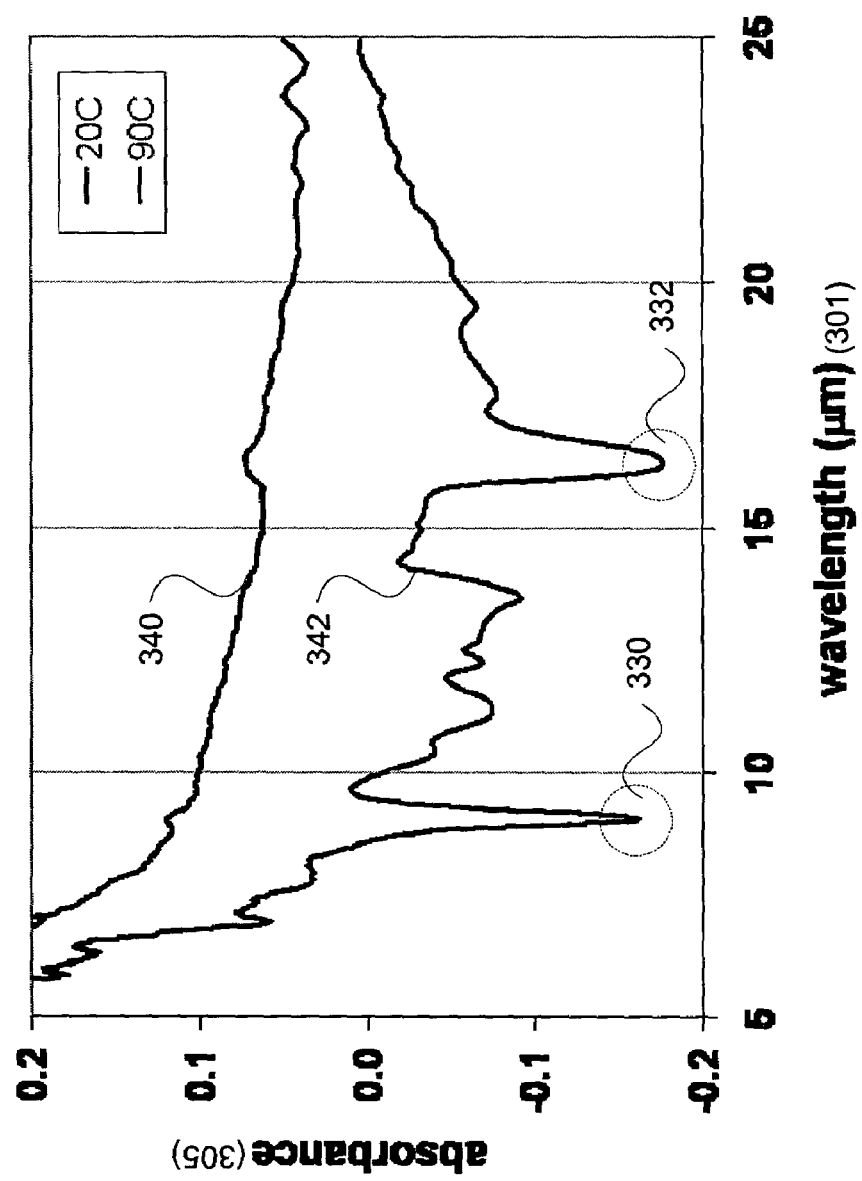

Referring now to FIG. 3C, a simplified diagram of wavelength versus absorbance within a plasma processing system is shown for two temperature ranges, according to one embodiment of the invention. Across the spectrum of IR radiation generated in the plasma processing system at 20 C 340, the substrates temperature is such that the amount of radiation emitted by the substrate is similar to the amount absorbed, and hence there are no apparent peaks. However, at a substrate temperature of 90 c, two absorbance peaks again become apparent, a first peak 330 at 16.4 μm produced by Si—Si, and a second peak 332 at 9.1 μn produced by Si—O—Si.

Figure 3D:
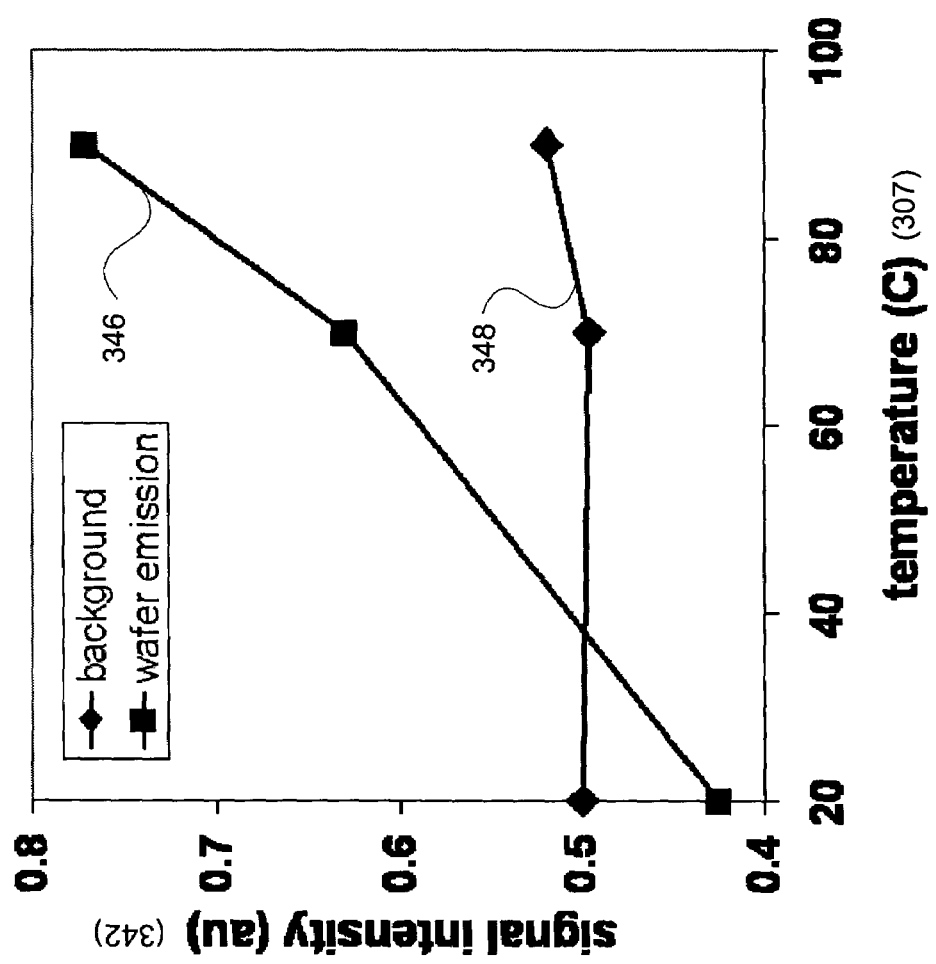

Referring now to FIG. 3D, a simplified diagram of signal intensity versus temperature within a plasma processing system is shown, according to one embodiment of the invention. Graph 346 measures signal intensity 342 versus temperature 307, while graph 348 measures signal intensity 342 versus temperature 307. As in FIG. 3B, the higher the substrate temperature, the higher the corresponding signal intensity.

Figure 3E:
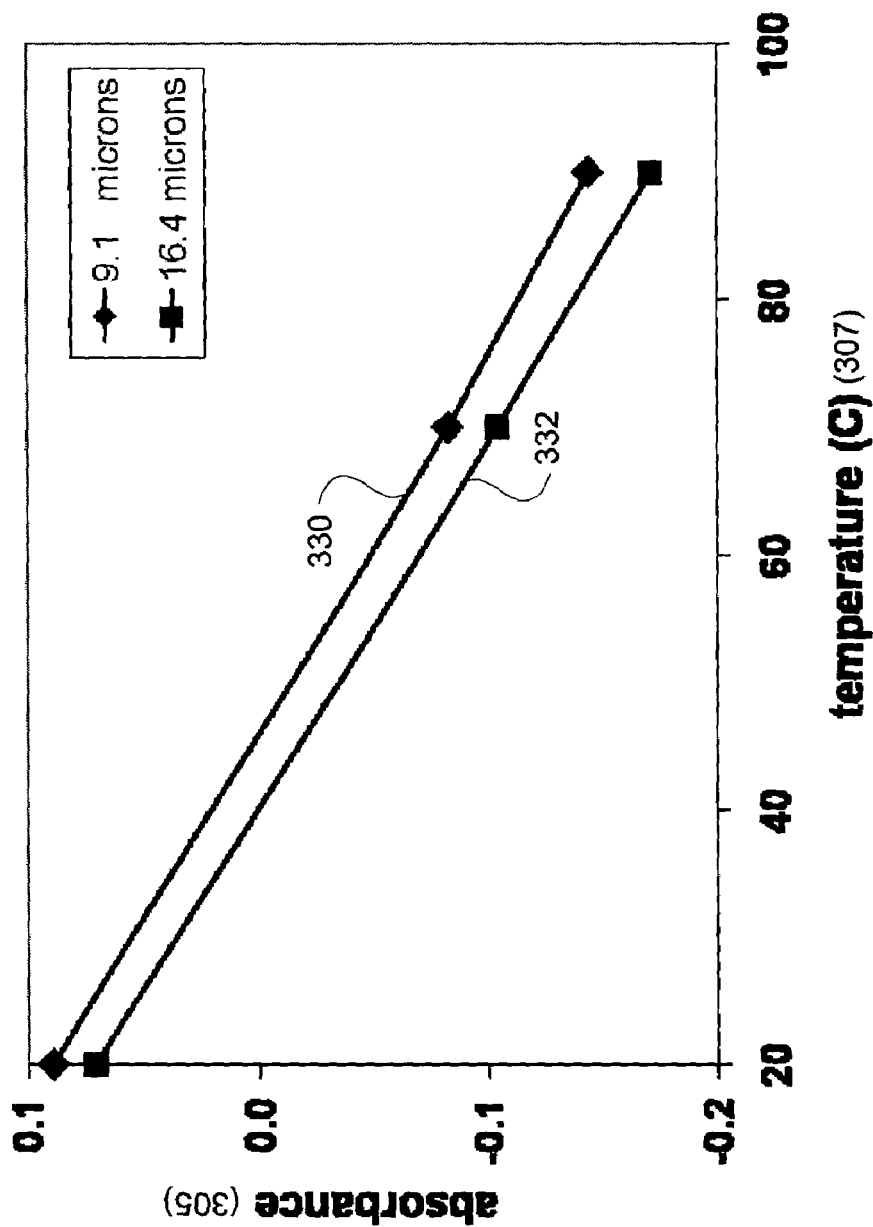

Referring now to FIG. 3E, a simplified diagram of absorbance versus temperature within a plasma processing system is shown for two measured wavelengths, according to one embodiment of the invention. A first graph 330 is shown for Si—Si at 16.4 μm produced, and a second graph 332 is shown for Si—O—Si at 9.1 μm. As the temperature 307 increases, the corresponding absorbance 305 decreases in a substantially linear fashion.

While this invention has been described in terms of several preferred embodiments, there are alterations, permutations, and equivalents which fall within the scope of this invention. For example, although the present invention has been described in connection with an Exelan HPT plasma processing system, other plasma processing systems may be used. It should also be noted that there are many alternative ways of implementing the methods of the present invention.

Advantages of the invention include measuring the temperature of a substrate it situ in a plasma processing system. Additional advantages may include optimizing the replacement of plasma processing structures, such as the chuck, increasing the yield of the plasma processing process itself, and facilitating the determination and transfer of a recipe from a first plasma processing system to a second plasma processing system. Having disclosed exemplary embodiments and the best mode, modifications and variations may be made to the disclosed embodiments while remaining within the subject and spirit of the invention as defined by the following claims.

What is claimed is:

1. In a plasma processing system, a method of determining a temperature of a substrate, comprising:

providing a substrate;

positioning said substrate on a substrate support structure, wherein said substrate support structure includes a chuck;

flowing an etchant gas mixture into a plasma reactor of said plasma processing system;

striking said etchant gas mixture to create a plasma;

processing said substrate with said plasma;

measuring, using a detector, a magnitude of emitted phonon-generated radiation of a select signal, said select signal having a select frequency that correspond to a frequency predetermined in advance based on material composition of said substrate to be strongly absorbed by said substrate during said processing;

converting said magnitude of said emitted phonon-generated radiation of said select signal to a temperature value of said temperature; and protecting said detector from said plasma by positioning said substrate between said plasma and said detector.

2. The method of claim 1, wherein said detector includes an electromagnetic radiation discriminating device.

3. The method of claim 1, further comprising protecting said substrate from contaminants produced by said detector by disposing said detector inside said substrate support structure.

4. The method of claim 1, wherein the step of converting said magnitude to said temperature value employs Plank's radiation law for blackbody radiation.

5. The method of claim 1, further including the step measuring said magnitude with an electromagnetic measuring device.

6. The method of claim 5, where said electromagnetic measuring device comprises a narrow-band pyrometer.

7. The method of claim 5, where said electromagnetic measuring device comprises a monochrometer.

8. The method of claim 5, where said electromagnetic measuring device comprises a grating.

9. The method of claim 5, where said electromagnetic measuring device comprises a band pass optical filter.

10. The method of claim 5, further including the step of adjusting a cooling system to maintain said temperature value substantially constant.

11. The method of claim 1, wherein said substrate is a wafer.

12. The method of claim 1, wherein said substrate is a glass panel.

13. The method of claim 1, wherein said plasma comprises a first set of electromagnetic frequencies, wherein said first set of electromagnetic frequencies comprise the infrared spectrum.

14. The method of claim 1, wherein said substrate being processed with said plasma thereby generating a second set of electromagnetic wherein. said second set of electromagnetic frequencies comprise the infrared spectrum.

15. The method of claim 1, wherein said plasma processing system is configured to perform chemical vapor deposition.

16. The method claim 1, wherein said plasma processing system is configured to perform plasma enhanced chemical vapor deposition.

17. The method of claim 1, wherein said plasma processing system is configured to perform physical vapor deposition.

18. The method of claim 1, wherein said etchant includes Carbon.

19. The method of claim 1, wherein said etchant includes Hydrogen.

20. The method of claim 1, wherein said etchant includes Fluorine.

21. The method of claim 1, wherein said etchant includes Nitrogen.

22. The method of claim 1, wherein said etchant includes Oxygen.

23. The method of claim 1, wherein said etchant includes Argon.

24. The method of claim 1, wherein said etchant includes Xenon.

25. The method of claim 1, wherein said etchant includes Helium.

26. The method of claim 1, wherein said etchant includes Sulfur.

27. In a plasma processing system, a method of determining the temperature of a substrate, comprising:

positioning said substrate on a substrate support structure;

flowing an etchant gas mixture into a plasma reactor of said plasma processing system;

striking said etchant gas mixture to create a plasma;

processed said substrate with said plasma;

measuring using a detector a magnitude of emitted phonon-generated radiation of a select signal said select signal having a select frequency that corresponds to a frequency predetermined in advance based on material composition of said substrate to be strongly absorbed by said substrate during said processing;

converting said magnitude of said emitted phonon-generated radiation of said select signal to a temperature value of said temperature; and protecting said detector from said plasma by positioning said substrate between said plasma and said detector.

28. The method of claim 1, wherein said etchant gas mixture includes chlorine.

29. The method of claim 1, wherein said etchant gas mixture includes boron.

30. The method of claim 1, wherein the wherein said select frequency corresponds to a frequency for which a signal strength of said select signal is most sensitive to temperature changes of said substrate.

31. The method of claim 27, wherein said plasma processing system further includes an electromagnetic radiation measuring device.

32. The method of claim 27, wherein said substrate is positioned between said plasma and said electromagnetic radiation measuring device.

33. The method of claim 27, wherein the step of converting said magnitude to said temperature value employs Phank's radiation law for blackbody radiation.

34. The method of claim 27, further including the step of measuring said magnitude with an electromagnetic measuring device.

35. The method of claim 34, where said electromagnetic measuring device comprises a narrow-band pyrometer.

36. The method of claim 34, where said electromagnetic measuring device comprises a monochrometer.

37. The method of claim 34, where said electromagnetic measuring device comprises a grating.

38. The method of claim 34, where said electromagnetic measuring device comprises a band pass optical filter.

39. The method of claim 34, further including the step of adjusting a cooling system to maintain said temperature value substantially constant.

40. The method of claim 27, wherein said substrate is a wafer.

41. The method of claim 27, wherein said substrate is a glass panel.

42. The method of claim 27, wherein said plasma comprises a first set of electromagnetic frequencies, wherein said first set of electromagnetic frequencies comprise the infrared spectrum.

43. The method of claim 27, wherein said substrate being processed with said plasma thereby generating a second set of electromagnetic frequencies, wherein said second set of electromagnetic frequencies comprise the infrared spectrum.

44. The method of claim 27, wherein said plasma processing system is configured to perform chemical vapor deposition.

45. The method of claim 27, wherein said plasma processing system is configured to perform plasma enhanced chemical vapor deposition.

46. The method claim 27, wherein said plasma processing system is configured to perform physical vapor deposition.

47. The method of claim 27, wherein said etchant includes Carbon.

48. The method of claim 27, wherein said etchant includes Hydrogen.

49. The method of claim 27, wherein said etchant includes Fluorine.

50. The method of claim 27, wherein said etchant includes Nitrogen.

51. The method of claim 27, wherein said etchant includes Oxygen.

52. The method of claim 27, wherein, said etchant includes Argon.

53. The method of claim 27, wherein sad etchant includes Xenon.

54. The method of claim 27, wherein said etchant includes Helium.

55. The method of claim 27, wherein said etchant includes Sulfur.

56. The method of claim 27, wherein the wherein said select frequency corresponds to a frequency for which a signal strength of said select signal is most sensitive to temperature changes of said substrate.

* * * * *